United States Patent
Kinney et al.

[11] Patent Number: 6,122,562
[45] Date of Patent: Sep. 19, 2000

[54] METHOD AND APPARATUS FOR SELECTIVELY MARKING A SEMICONDUCTOR WAFER

[75] Inventors: Patrick D. Kinney, Coon Rapids, Minn.; Yuri Uritsky, Newark, Calif.; Nagaraja Rao, Minneapolis, Minn.

[73] Assignee: Applied Materials, Inc., Santa Clara, Calif.

[21] Appl. No.: 08/850,954

[22] Filed: May 5, 1997

[51] Int. Cl.[7] .................................................. G06F 19/00
[52] U.S. Cl. ............................................................ 700/121
[58] Field of Search .................................... 324/158, 754; 356/237, 399; 250/492.2; 358/296; 437/225; 355/53; 395/500; 29/832, 833, 834, 836, 744; 700/108, 109, 110, 121, 95

[56] References Cited

U.S. PATENT DOCUMENTS

| | | | |
|---|---|---|---|
| 4,390,789 | 6/1983 | Smith et al. | 250/492.2 |
| 4,467,211 | 8/1984 | Smith et al. | 250/492.2 |
| 4,568,879 | 2/1986 | Nakamura et al. | 324/158 |
| 5,204,912 | 4/1993 | Schimanski | 382/147 |
| 5,238,499 | 8/1993 | Van De Ven et al. | 118/724 |
| 5,473,409 | 12/1995 | Takeda et al. | 355/53 |
| 5,479,252 | 12/1995 | Worster et al. | 356/237 |
| 5,497,007 | 3/1996 | Uritsky et al. | 250/491.1 |
| 5,521,709 | 5/1996 | Bossen et al. | 358/296 |
| 5,537,325 | 7/1996 | Iwakiri et al. | 364/468.28 |
| 5,563,520 | 10/1996 | Terada | 324/754 |
| 5,610,102 | 3/1997 | Gardopee et al. | 437/225 |
| 5,640,100 | 6/1997 | Yamagata et al. | 324/754 |
| 5,649,169 | 7/1997 | Berezin et al. | 395/500 |
| 5,706,091 | 1/1998 | Shiraishi | 356/399 |
| 6,021,380 | 2/2000 | Fredrikson et al. | 702/35 |
| 6,052,185 | 4/2000 | Banet et al. | 356/345 |

FOREIGN PATENT DOCUMENTS

| | | | |
|---|---|---|---|
| 0 402 230 A1 | 12/1990 | European Pat. Off. | H01L 23/544 |
| 63-287030 | 11/1988 | Japan | H01L 21/68 |
| 2 292 603 | 2/1996 | United Kingdom | G01N 21/88 |

*Primary Examiner*—William Grant
*Assistant Examiner*—Chad Rapp
*Attorney, Agent, or Firm*—Thomason, Moser & Patterson

[57] ABSTRACT

A method and apparatus that accurately marks a wafer at selected locations such as a defect location on the surface of a wafer such that a wafer analysis system (e.g., SEM or AFM) may rapidly find the defect. The apparatus contains a wafer platen for retaining a wafer in a substantially horizontal orientation and a marking assembly mounted above the wafer platen. The marking assembly further contains an optical microscope and a marking head. In operation, a user locates a defect using the optical microscope and places a pattern of fiducial marks at a predetermined distance from the defect, e.g., four marks in a diamond pattern circumscribing the defect.

54 Claims, 6 Drawing Sheets

FIG. 5

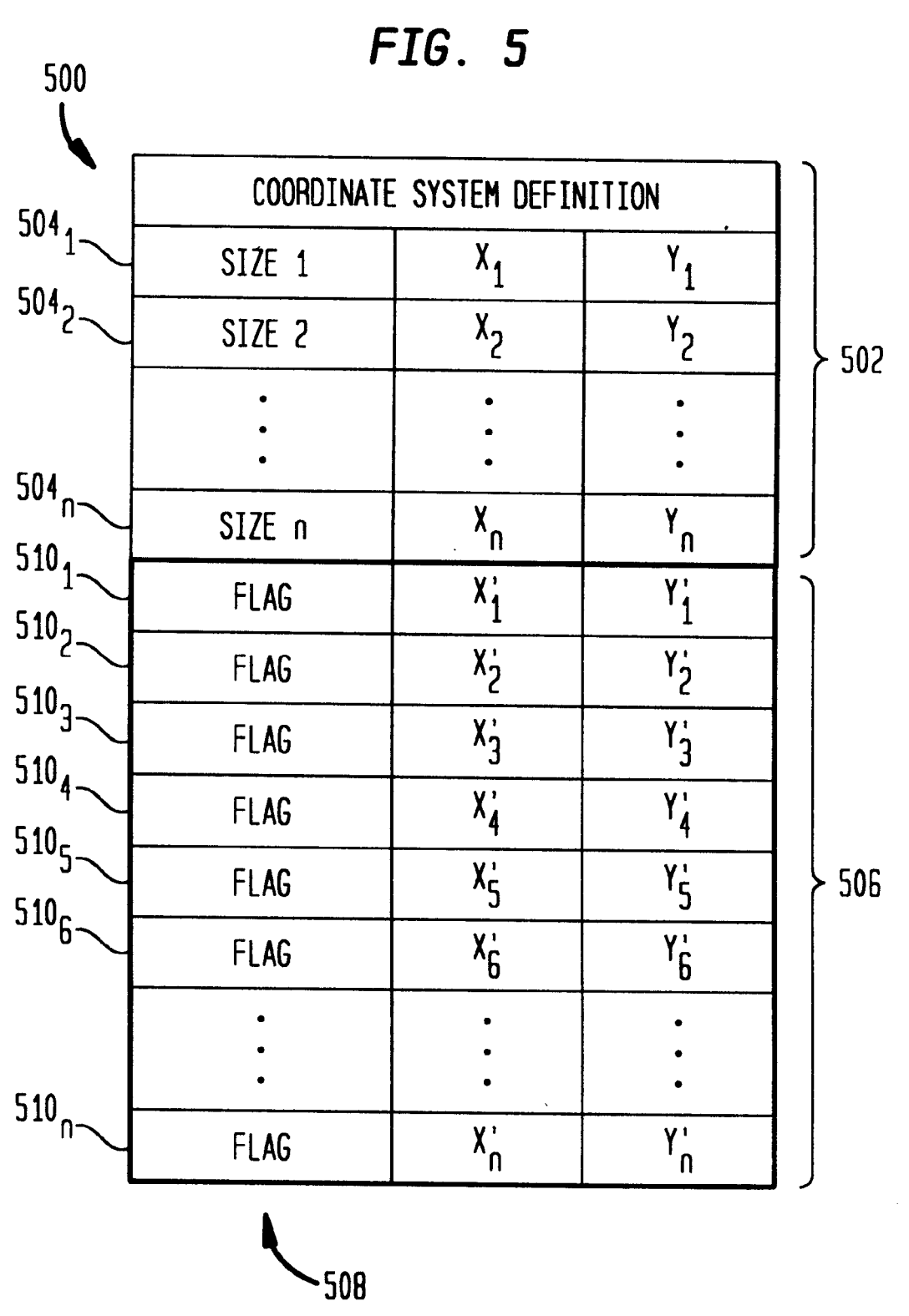

| COORDINATE SYSTEM DEFINITION | | |
|---|---|---|
| SIZE 1 | $X_1$ | $Y_1$ |
| SIZE 2 | $X_2$ | $Y_2$ |
| ⋮ | ⋮ | ⋮ |
| SIZE n | $X_n$ | $Y_n$ |
| FLAG | $X'_1$ | $Y'_1$ |
| FLAG | $X'_2$ | $Y'_2$ |
| FLAG | $X'_3$ | $Y'_3$ |
| FLAG | $X'_4$ | $Y'_4$ |
| FLAG | $X'_5$ | $Y'_5$ |
| FLAG | $X'_6$ | $Y'_6$ |
| ⋮ | ⋮ | ⋮ |
| FLAG | $X'_n$ | $Y'_n$ |

METHOD AND APPARATUS FOR SELECTIVELY MARKING A SEMICONDUCTOR WAFER

BACKGROUND OF THE DISCLOSURE

1. Field of the Invention

The invention relates to semiconductor wafer processing equipment and, more particularly, the invention relates to a method and apparatus for selectively marking a semiconductor wafer with identifiable markings.

2. Description of the Background Art

Identifying defects on the surface of a wafer, such as particulate contaminants and other surface irregularities, is extremely important to integrated circuit manufacturing processes. To eliminate defect sources, defects are identified and analyzed to determine the source of the defect. Thereafter, corrective action can be taken to reduce or eliminate the defect source.

Typically, the defect identification process is accomplished in two steps. First, a laser scanner device scans a wafer with a laser and analyses the backscatter of the laser to locate defects on the surface of the wafer. One such laser scanner device is a Tencor SurfScan 6200, manufactured by Tencor Instruments. Second, each defect located by the scanner is analyzed to identify the root cause of the defect. The most commonly employed analysis tool is a high magnification imaging system such as a scanning electron microscope (SEM). An SEM is used to identify the defect and/or the source of the defect by inspecting the defect at high magnification. Additionally, the SEM may be accompanied by instrumentation for performing chemical analysis of the defect. Such instrumentation includes an energy dispersive x-ray (EDX) detector. Other tools may include instrumentation for performing an Auger analysis, an atomic force microscope (AFM), a tunneling electron microscope (TEM), an optical spectrometer and the like.

Since the SEM as well as other analysis tools use a high magnification (on the order of 200 to 2000 times), rapidly positioning the SEM at the defect location can be time consuming. Although the laser device provides defect coordinates that are accurate to approximately 300 microns, a substantial amount of time can be spent manually searching, for example, a 300 by 300 micron region with the SEM for a defect having dimensions of a few tenths of micron.

Additionally, when using a SEM (or other optical analysis tool) to analyze a "bare" wafer, i.e., a wafer having no surface features, the SEM has difficulty focusing on the wafer surface. Without an accurate focus, finding a small defect on the surface is nearly impossible.

Furthermore, some defects are identified by laser scanning, but cannot be seen with a SEM. As such, the SEM operator may search for a defect for a long period of time until realizing the defect cannot be seen with the SEM.

Some defect analysis tools, e.g., an atomic force microscope (AFM), are not readily useful when a large search area is used. Generally, the field of view for an AFM is approximately 10 $\mu m^2$, and the search area is as large as 300 $\mu m^2$. Unfortunately, an AFM requires approximately five minutes to obtain a 10 $\mu m^2$ image. As such, 900 images are required to cover a 300 $\mu m^2$ search area, requiring 4500 minutes to complete the search.

Therefore, a need exists in the art for a method and apparatus that selectively marks a wafer proximate a defect such that the defect can be rapidly identified and examined with a SEM or other defect analysis system.

SUMMARY OF THE INVENTION

The invention overcomes the disadvantage of the prior art by providing a method and apparatus that accurately marks a defect location on the surface of a wafer such that a defect analysis system (e.g., SEM) may rapidly identify the location of the defect. Additionally, the wafer marking apparatus is used to fiducialize the wafer as a whole, or portions of a wafer, irrespective of the presence of defects. As such, analysis tools subsequently used to analyze a wafer or a portion of a wafer may use the fiducialization marks as a repeatable coordinate system to which defect locations (or any position) on the wafer are referred.

Specifically, the apparatus contains a wafer platen for retaining a wafer in a substantially horizontal orientation, a wafer marking assembly, a dark-field microscope, and a charged coupled device (CCD) camera mounted above the wafer platen. In operation, a wafer is positioned upon the platen and retained thereupon using a vacuum chucking technique. A user then locates a defect on the wafer using the optical microscope. The microscope is preferably operated in a dark-field mode such that, for a bore wafer, the defects appear as white spots on a black background. Once a defect is located, the user places a pattern of marks at predetermined distances from the defect, e.g., four marks in a diamond pattern equidistant from and circumscribing the defect.

To locate defects, a defect location file produced by a laser scanning device is used to initially position the optical microscope at the approximate location of the defect. From this initial position, a user searches the wafer surface about the initial position until the actual defect is located and centered in the microscope's field of view. The wafer is then marked and the defect location file is updated with the coordinates of each mark in the pattern. As such, a subsequent analysis stage, such as an SEM, can rapidly locate the fiducial marks as well as the defect using the mark coordinates.

Further automation is added to the invention by coupling a high sensitivity, low light level, cooled CCD camera to the optical microscope. The CCD camera enhances the defect detection process by increasing the sensitivity of the optical microscope while operating in a dark-field mode for detecting small particles as well as facilitates use of an automatic defect search and marking routine.

BRIEF DESCRIPTION OF THE DRAWINGS

The teachings of the present invention can be readily understood by considering the following detailed description in conjunction with the accompanying drawings, in which:

FIG. 5 depicts an illustrative file structure containing coordinates of initial defect locations as well as coordinates of marks produced by the apparatus of FIG. 1.

To facilitate understanding, identical reference numerals have been used, where possible, to designate identical elements that are common to the figures.

DETAILED DESCRIPTION

Figure 1:
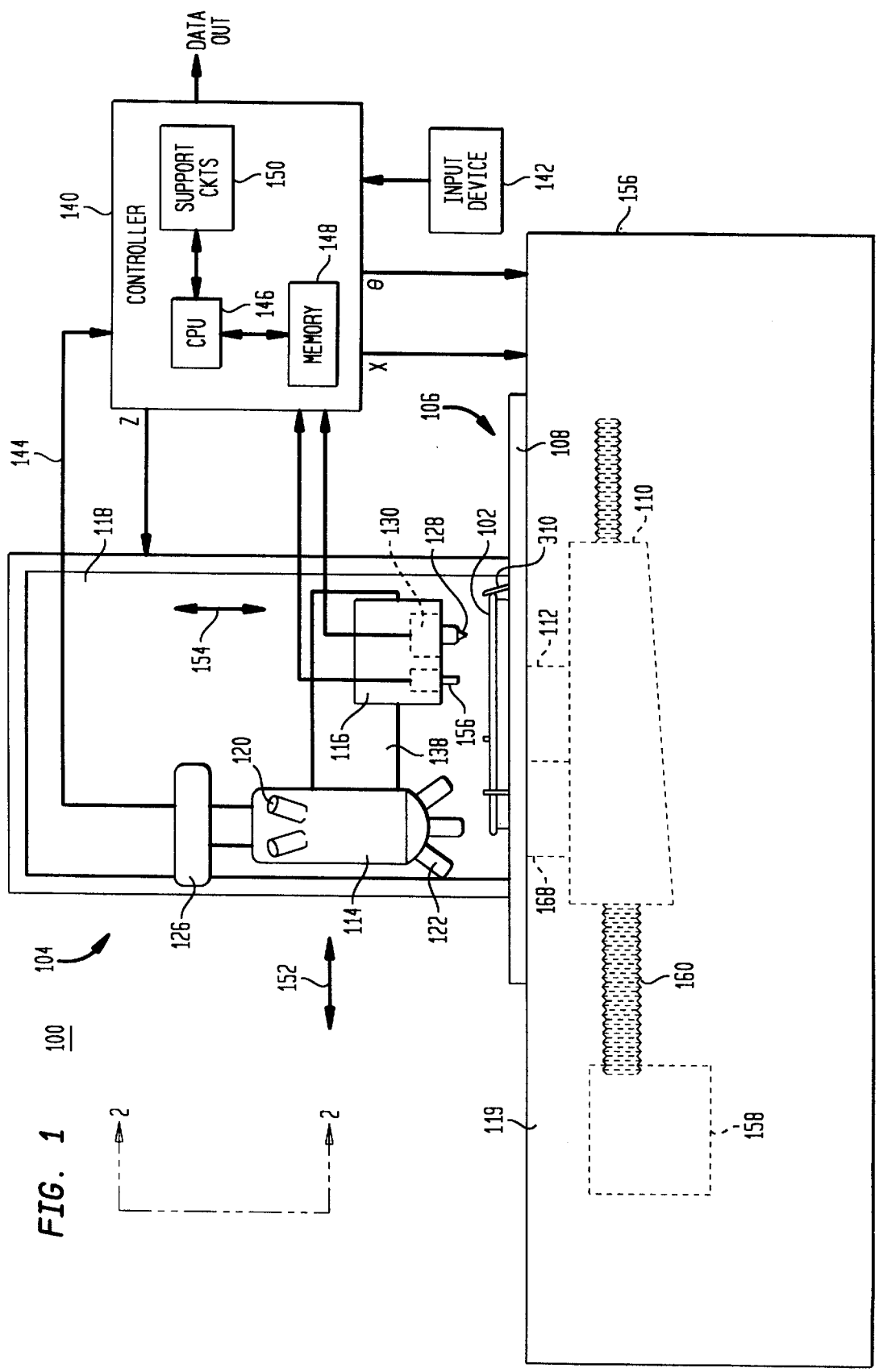
FIG. 1 depicts a front, simplified schematic view of the wafer marking apparatus of the present invention.
Figure 2:
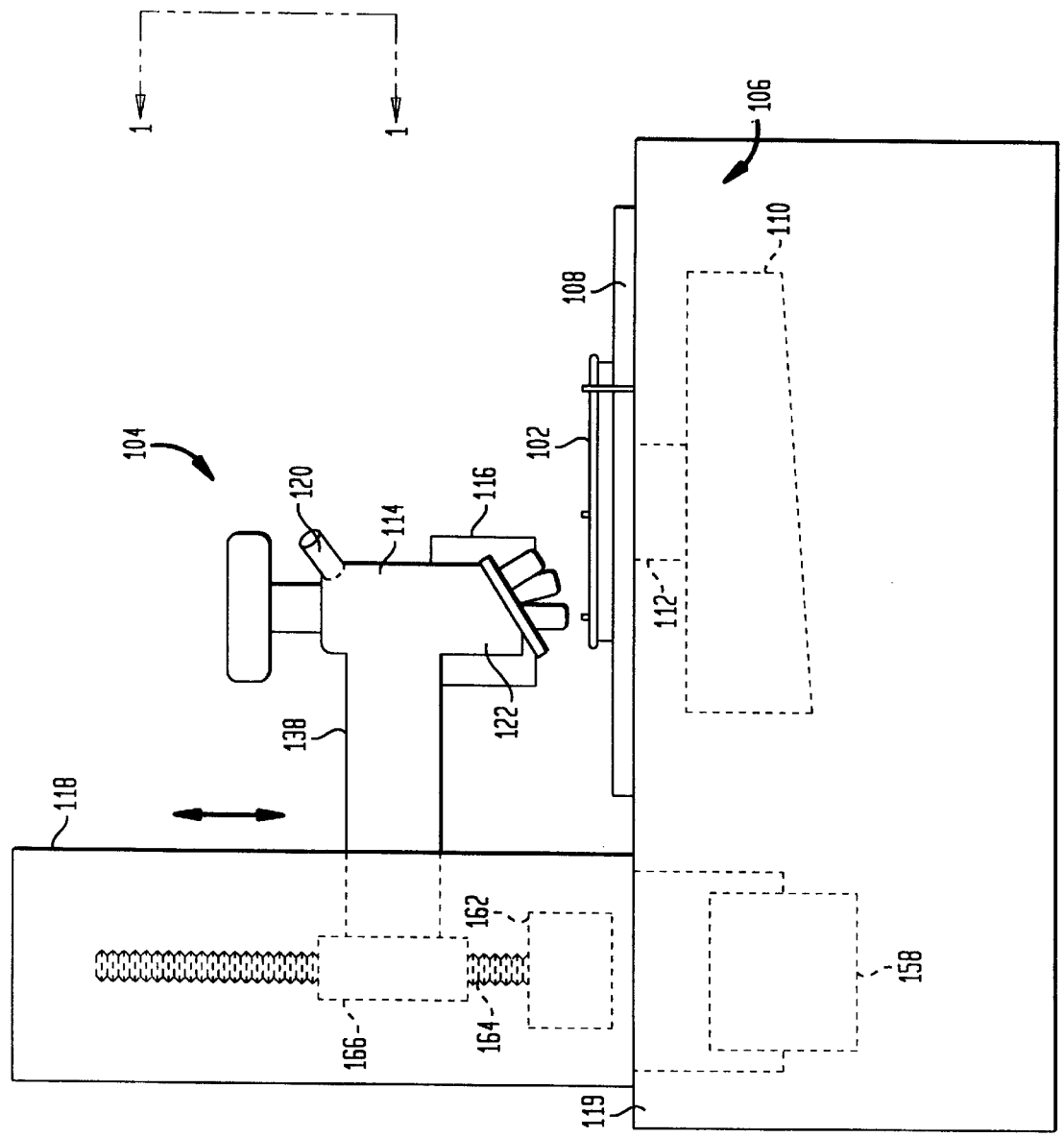
FIG. 2 depicts a side view of the inventive wafer marking apparatus taken along line 2—2 of FIG. 1.

FIG. 1 and FIG. 2, respectively, depict front and side views of a simplified, schematic diagram of a wafer marking system 100 for selectively marking a wafer 102 such that defects can be clearly marked for easy identification using defect analysis equipment, e.g., scanning electron microscope (SEM), atomic force microscope (AFM) and the like. The wafer marking system 100 contains a marking assembly 104, a wafer platen assembly 106, positioning assemblies 118 and 119, and a controller 140. The wafer platen holds a wafer 102 and rotates the wafer relative to the marking assembly 104. The marking assembly 104 moves along the "X-axis" (arrow 132) to locate surface defects, then marks the location of the defect by moving the marking assembly along the "Z-axis" (arrow 154). The location of the defect is marked with an easily identifiable pattern of fiducial marks. The controller 140 performs relative positioning of the wafer 102 and marking assembly 104.

More specifically, the platen assembly 106 contains a wafer platen 108 and a platen drive 110 (located within a base housing 156). The platen is a circular plate that holds the wafer 102 in a substantially horizontal orientation using a conventional vacuum chucking technique. Other well-known wafer retention techniques include electrostatic chucks, clamp rings, and the like. The platen drive 110 is coupled to the platen 108 by a shaft 112. The drive rotates the shaft to rotate the platen up to 360 degrees. The drive is, for example, a 0.1 horse power, stepper motor. A detailed description of the platen 108 appears below with respect to FIG. 3.

The rotational motion of the platen is used to both compute a wafer coordinate system and facilitates wafer positioning for marking. A description of the wafer coordinate system computation appears below.

The marking assembly 104 contains a defect imaging device, such as an optical microscope 114, and a marking head 116. The marking assembly is positioned along the Z-axis by Z-axis positioning assembly 118 (e.g., a pneumatic lift) and along the X axis by the X-axis positioning assembly 119 (e.g., also a pneumatic positioner). By positioning the marking assembly using the X-axis positioning assembly 119 and positioning the wafer using the platen drive 110, any location on the wafer may be positioned beneath the marking assembly 104.

Although the defect imaging device may be any device that facilitates locating defects on the surface of a wafer, preferably, the device is an optical microscope 114. The optical microscope 114 contains an eye piece 120 and a lens assembly 122. To view the surface of the wafer, a user looks through the eye piece 120 and manually focuses the lens assembly 122 by manipulating the Z-axis position of the microscope relative to the wafer surface. Such focusing is facilitated by manipulating an input device 142 (e.g., a joystick). The controller 140 uses the information from the input device to adjust the Z-axis position of the microscope.

For best results and the capability of identifying defects as small as 0.08 microns, the microscope preferably operates in a dark-field mode. An illustrative microscope having a dark-field mode is available from Nikon as Model Number Optiphot-150. Once focused onto the wafer surface, the user can view defects on the surface of the wafer. In dark-field mode, the defects on a bare wafer appear as white specks on a black background. Although the optical microscope 114 is discussed as being manually focused, those skilled in the art will understand that an automatic focus system can be employed to achieve focus automatically.

Additionally, the optical assembly contains an optional CCD camera 126. This CCD camera is used to obtain a digital image of the wafer surface as viewed by the microscope. The CCD camera contains a high-sensitivity, low light level, cooled CCD array that facilitates high grade and low noise imaging. With the microscope operating in dark-field mode, the camera produces an image of a bare wafer depicting the wafer surface as a black area and each defect as a white area. The CCD camera can detect defects that the human eye cannot even see.

To facilitate an automatic defect search method, the CCD image is optionally coupled to the control circuitry 140 (as represented by line 144). As such, image information is coupled to the controller for analysis and storage. By analyzing the image, the controller can detect when a defect is centered in the microscope's field of view. As such, a search routine can be implemented to automatically locate and mark defects. This fully automatic embodiment of the invention is discussed below.

The optical assembly 114 is coupled to the marking head 116. The marking head contains a marking tip 128 and a load cell 130. In operation, the Z-axis positioning assembly 118 moves the marking tip downward until the tip contacts the wafer 102. The tip 128 is preferably a hard substance such as diamond. As such, upon contact with the wafer surface, the tip indents the surface of the wafer without producing additional particulate contaminants. The load cell 130 measures the amount of force that the tip applies to the wafer surface and couples the load information to the controller 140.

Although the marking head described herein forms a mark by indentation, other apparatus for marking a wafer are within the scope of this invention. Such marking apparatus include a laser marking device, an ion marking device, ink-spraying, felt tip pen, and the like.

The marking head 116 and optical microscope 114 are mounted to a support arm 138. The support arm 138 is fixedly attached at one end to the Z-axis positioning assembly 118. The positioning assembly 118 linearly positions the support arm along a Z-axis, while the positioning assembly 119 positions the support arm along an X-axis. Illustratively, each drive assembly 119 and 118 contains an electric motor 158 and 162 coupled to a worm gear 160 and 164. Slidable positioners 166 and 168 are coupled to respective worm gears 164 and 160 in a conventional manner to move the support arm 138.

Preferably, a defect is marked with an identifiable indentation pattern. The pattern is automatically generated by system controller 140. The controller is a general purpose computer (e.g., comprising a central processing unit (CPU) 146, memory 148 and various support circuits 150 such as power supplies, cache, I/O circuits and the like) that is programmed to cause the system 100 to perform the routines and methods of the present invention. Alternatively, the controller can be a dedicated microprocessor or application specific integrated circuit (ASIC) that is specially designed or programmed to control the system.

The controller 140 is coupled to an input device 142. The input device is a joystick or other two dimensional control device for positioning the platen and marking assembly. The input device further contains a button (e.g., keyboard) to activate the marking process once the marking assembly is positioned. Furthermore, the controller contains a data port for generating the mark locations as a computer file for the next stage of wafer analysis, e.g., an SEM or AFM stage or for storage in a remote storage unit. To facilitate positioning and marking, the control circuitry is coupled to the positioning assemblies 118 and 119, the platen drive 110 and the load cell 130.

The marking assembly 106 also contains sensor 152 for mapping the edge of the wafer. Specifically, the marking assembly 116 further contains a linear variable differential transformer (LVDT) 152 mounted proximate the marking head 128. Specifically, the transformer 152 mounts at a fixed location such that the platen 108 can rotate relative to the transformer 152. The transformer 152 contains a sensor pin that abuts the edge of the wafer 102. The transformer 152 produces electrical signals in response to movement of the sensor pin relative to an electromagnetic coil. As such, as the platen (and wafer) are rotated, the sensor pin maps an edge profile of the wafer. Since a set of multiple points along the wafer edge is all that is required to produce an accurate edge profile, the transformer 152 is retracted from the wafer to avoid contact with either pin 300 or 302 as well as the bias element 304 and contacts the wafer only at a plurality of predefined points (see FIG. 3). For example, three points along the wafer periphery are used to compute the wafer profile. The set of points are fitted to a representative circle that accurately portrays the edge boundary of the wafer. From this circle, the center of the wafer can be computed. The edge points and center are used to define the wafer coordinate system within which the fiducial marks and defects are referred. One technique for computing wafer edge boundary and center coordinates from a set of edge points is disclosed in commonly assigned U.S. Pat. No. 5,497,007 issued Mar. 5, 1996 to Yuri S. Uritsky and Harry Q. Lee.

Figure 3:
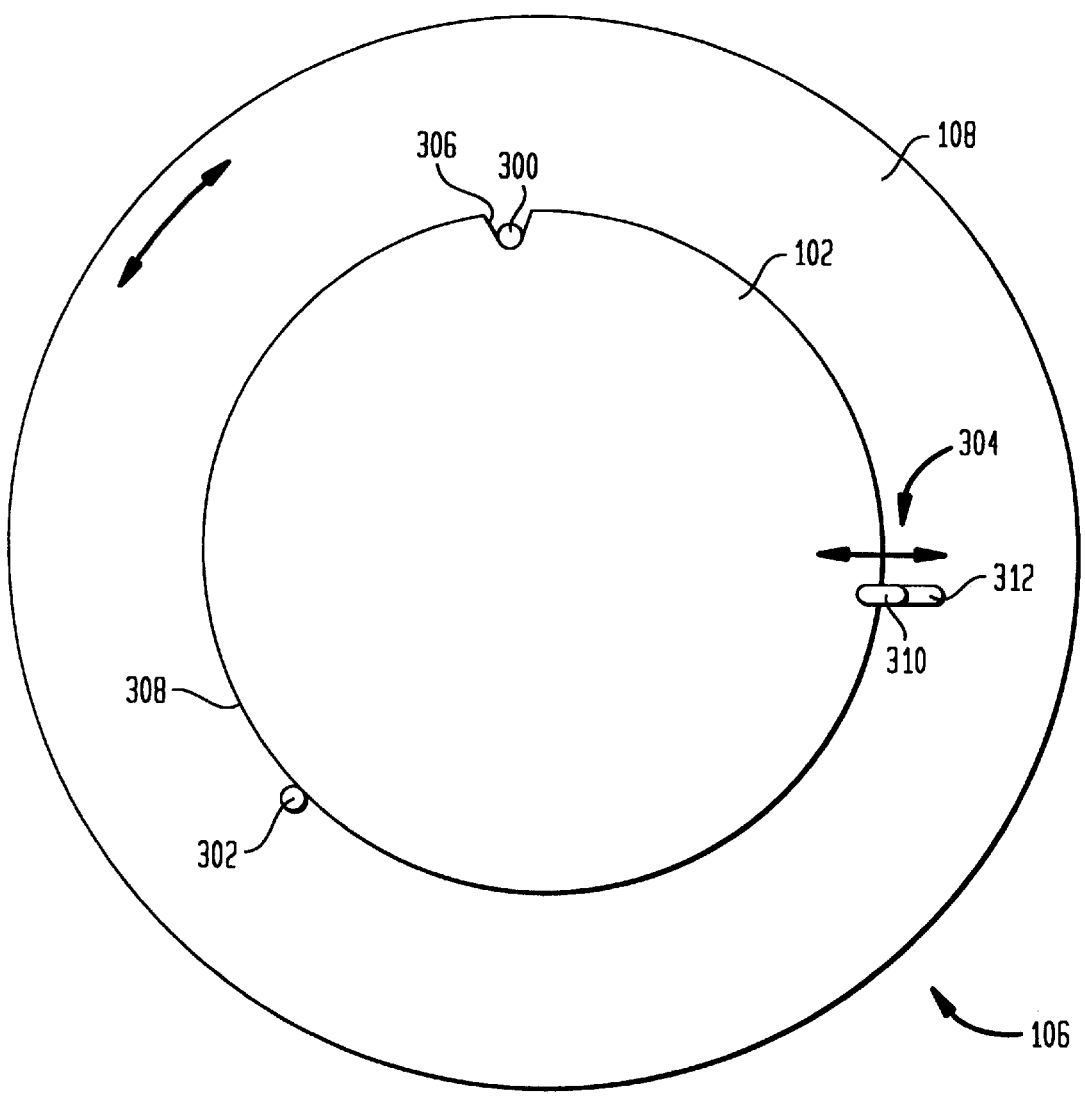
FIG. 3 depicts a top plan view of the wafer platen of the apparatus depicted in FIGS. 1 and 2.

FIG. 3 depicts a top view of the platen 108 for holding a wafer 102 in a stable, repeatable position. The platen 108 has a notch pin 300, an edge pin 302 and a wafer bias element 304. The notch pin 300 interfits the wafer notch 306, the edge pin 302 rests against the wafer edge 308 and the bias element 304 biases the wafer against the respective pins. The bias element 304 is a spring loaded pin 310 that slidably engages a bore through a stationary pin support area 312. A spring or some other biasing element (not shown) maintains the pin 310 against the edge 308 of the wafer 102 to bias the wafer against the edge and notch pins. As such, the wafer is held in a stationary position until the vacuum chucking technique clamps the wafer to the platen.

Figure 4:
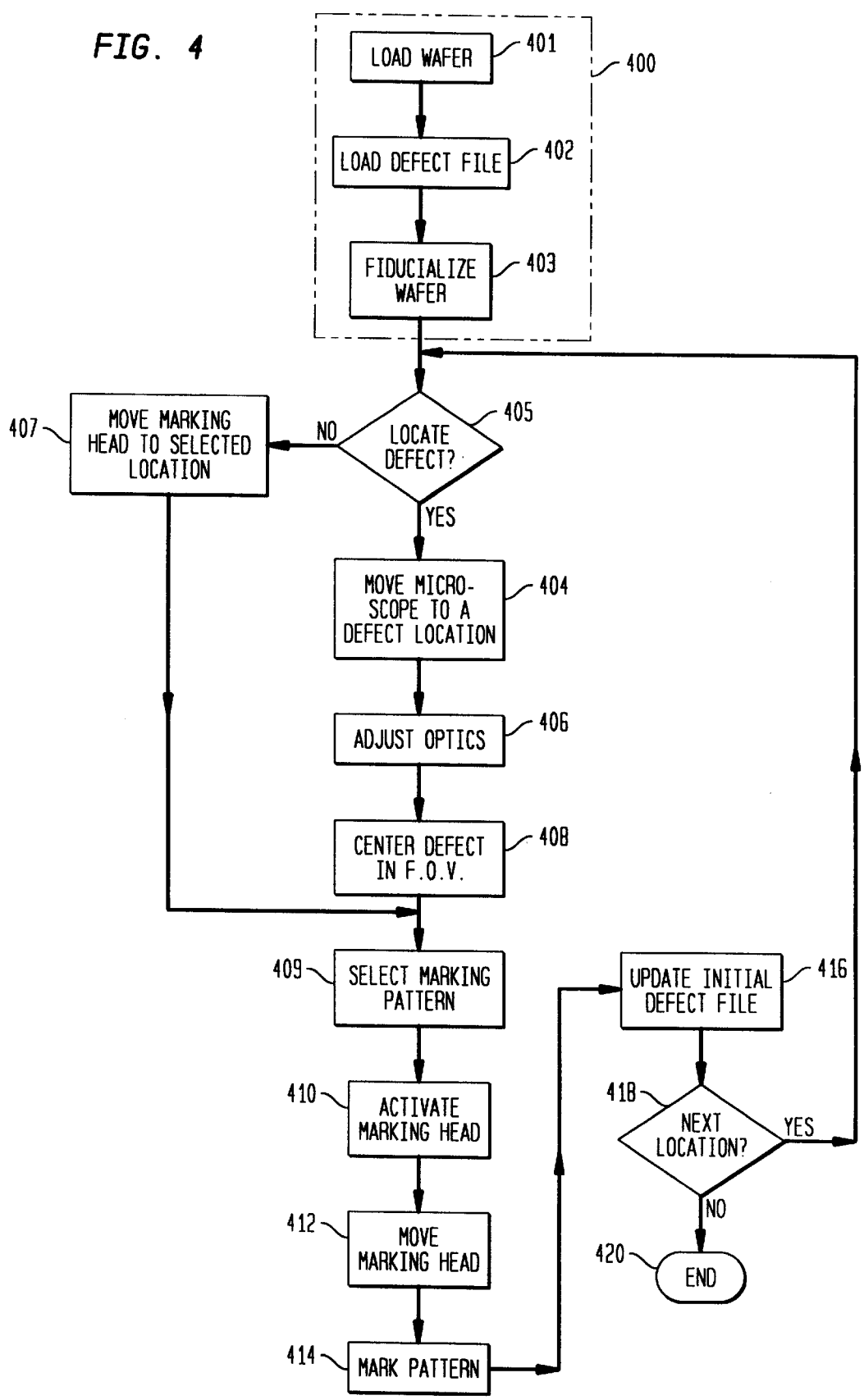
FIG. 4 depicts a flow diagram representing the process used by the apparatus of FIG. 1 to mark a wafer.

FIG. 4 depicts a flow diagram which outlines the operational steps used by the controller to operate the system of the present invention. At step 400, the system is initialized. During step 401 of the initialization sub-routine, a wafer is moved from a laser scanning device (e.g., a Tencor scanner) and, at step 402, the laser scanning device defect location table, a computer file, is downloaded into the controller of the present invention. This computer file is referred to herein as the initial defect file. The initial defect file contains information defining a wafer coordinate system (relative to the scanning device) as well as x and y coordinates for each defect identified by the laser scanner device and the approximate size of the defect. A typical file structure 500 appears in the top half 502 of the file (table) shown in FIG. 5. Note that each row $504_n$ of the file identifies a defect coordinate $(x_n, y_n)$ as well as the size (size n) of the defect (where n is an integer greater than zero that identifies each defect by a unique number).

To complete initialization of the system, the controller uses, at step 403, the LVDT sensor to compute the edge and center coordinates of the wafer. Since the position of the wafer notch is known, i.e., at the location of the notch pin 300 of FIG. 3, a coordinate system is defined having, for example the origin at the wafer center and the y-axis intersecting the notch. This coordinate system forms the basis for the coordinates of all marks made on the wafer. In other words, this step fiducializes the wafer using the wafer geometry. This is known as first order fiducialization.

Then, a second order fiducialization is performed by locating several defects using the first order fiducialization coordinate system and the initial defect file defect coordinates. As such, the first order coordinate system is "corrected" to achieve a second order coordinate system that is used to identify x,y coordinates of the marks.

Specifically, the coordinate system transformation is accomplished by comparing the actual x,y coordinates of two points with the x,y coordinates for the same two points identified in the defect file. The comparison results in a set of coordinate system transformation parameters $\Delta x, \Delta y, \Theta$. These parameters can be used to "correct" all the coordinate locations in the defect file. Alternatively, the invention may operate using the defect file coordinate system (i.e., "incorrect" coordinates) and "correct" the marking location coordinates using the defect file coordinates. With either manner of correction, the result is a set of mark coordinates having the same coordinate system as the defect coordinates.

As discussed above, the coordinate system used by a laser scanner device as well as the coordinates of the defects are relatively inaccurate, e.g., a defect is generally within a 300 micron by 300 micron square. To easily find a defect using an SEM in such a large expanse of wafer surface area, the marking system of the present invention is activated to accurately identify the defect location and update the laser scanner device computer file (the initial defect file) to produce an updated defect file. The system then uniquely marks the defect for easy identification within the SEM stage.

However, locating and marking defects is not the only use of the wafer marking apparatus. The invention can be used to place fiducialization marks on a wafer irrespective of defects on the wafer. Such wafer fiducialization is necessary for aligning the wafer within subsequently used wafer analysis tools. When analyzing unpatterned wafers ("bare" wafers), there are no features on the wafer surface to use as fiducial marks from tool-to-tool. As such, different tools may compute different wafer coordinate systems. The present invention is used to produce universal fiducial marks on the wafer. Thereafter, every analysis stage uses these fiducial marks to define a wafer coordinate system. To make the fiducial marks easy to find, a pattern of marks is used at each fiducial mark location. As such, the fiducial marks can be easily observed even when the wafer contains many defects or other surface features.

To facilitate user selection of either defect marking or fiducialization marking, the method of FIG. 4 contains step 405 which queries whether the user desires to locate defects. If the query at step 405 is affirmatively answered, the method proceeds to step 404 where a subroutine is executed to facilitate defect marking. However, if the query is negatively answered, the method proceeds to step 407. At step 407, the invention moves the marking head to a position to mark the wafer with wafer fiducialization marks (i.e., second order fiducialization marks). Generally, the marks are positioned in an unusable region of the wafer, e.g., near the periphery.

It should be noted that if, for example, the wafer marking apparatus is only to be used for wafer fiducialization, the inventive apparatus does not need to contain a microscope or any imaging device. As such, the apparatus would operate by first order fiducializing the wafer and then marking the wafer with fiducialization marks.

If the query at step 405 is affirmatively answered, the process proceeds to step 404 to mark defects located on the surface of the wafer. At step 404, the marking system moves the wafer platen assembly and marking assembly to position a user selected defect location (e.g., a first location) in the initial defect file approximately beneath the microscope. At step 406, the microscope is focused (either manually or automatically) onto the wafer surface.

At step 408, the user manipulates the input device, e.g., a joystick, to move the wafer platen and/or the marking assembly along their respective axes of motion. When the defect is positioned beneath the optical microscope and is clearly seen by the user looking through the eyepiece, the manipulation is stopped. Alternatively, the CCD sensor can be used to automatically identify when the defect is within the field of view of the optical microscope. In such an automated system, the controller uses one of many well-known search algorithms that optimally search a small region proximate the initial position until the defect is aligned beneath the optical microscope.

At step 409 the controller of the invention queries the user for a selection of the marking pattern to be used to either mark the defect or the fiducial marks of the wafer. This query may be a computer screen pull down menu, an alphanumeric entry, an icon selection, and the like. Additionally, no selection may be available at all and the user may be required to use a fixed, predefined marking pattern. Typical patterns include a "diamond" pattern having four marks that are equidistant from and circumscribe the defect, a circular pattern having six or eight marks circumscribing the defect, a pair of marks positioned on either side of the defect and the like. Furthermore, to aid in subsequent defect analysis, different mark patterns can be used to identify different types of defects. In addition to the marking pattern, the user may also define the marking force.

Once aligned in the field of view, at step 410, the user depresses the marking activation switch or button. In response to the marking request, the controller moves the marking head into position above the defect. The controller then, at step 414, marks the wafer with the selected marking pattern. Specifically, the head is offset from the defect by a predefined distance, and the marking tip is moved into contact with the wafer surface to indent the surface. The head is then raised and moved a predefined distance relative to the previous position. At the next location, a second mark is made on the wafer. This procedure continues until all the marks are made in the predefined pattern proximate the defect. Each mark forms an indentation using the predefined force as monitored by the load cell.

At step 416, the initial defect file is updated to include the mark locations proximate the defect. As shown in the "bold" section 506 of the file structure 500 of FIG. 5, the coordinates of the fiducial marks are appended to the bottom of the file structure 500. These coordinates identify the x' and y' coordinates of the marks associated with each defect, e.g., the first set of marks proximate a first defect are identified by a coordinate $x'_1, y'_1$ that is a coordinate located at the center of the marking pattern. Since each of the marks in a pattern are a known distance from the center, only a single coordinate set x',y' is necessary to define the location of the entire marking pattern. Additionally, the mark coordinates are differentiated from the initial defect coordinates using a unique code (FLAG) $508_n$ in the "defect size" field 508 of the file 500. As such, the file and its mark coordinates can be used by subsequent defect analysis stages, e.g., SEM or AFM, to rapidly and accurately find the defects to be analyzed.

At step 418, the system queries whether another location is to be marked. If another defect location is contained in the initial defect file and/or the user desires to mark another location, the system proceeds to step 405 and moves the selected location beneath the optical microscope and/or marking head. If another location is not to be marked, the system stops the marking process at step 420.

At this time, the entire initial defect file (or selected defects in the file) has been converted into an updated defect file that contains all of the mark coordinates associated with each marked defect. This updated file is available for downloading to a SEM stage, AFM stage or other defect analysis device. Using the information contained in the updated defect file, the SEM or AFM is easily positioned proximate the defect and within the marking pattern. Consequently, by knowing the relative distance between the marks and the defect, low contrast defects are easily detected for SEM viewing without using a time consuming search over a large area.

To improve the speed at which defects are located, the CCD camera is active while the wafer is moved in a predetermined search pattern, e.g., raster scan. When the defect passes through the camera's field of view, the defect appears as a line in the detected image. As such, image processing software need only process one line of image data rather than an entire image.

Furthermore, the use of a CCD camera enables the system to be fully automated. For example, the coordinates in the initial defect file are used to position the optical microscope and then the controller automatically searches about the initial coordinates until the defect is found by the CCD camera. Thereafter, the defect location is moved beneath the marking head and a mark pattern is generated. The microscope is then moved to the next initial coordinates while the updated file is generated.

Another application for wafer marking is the locating of defects on "pieces" of a wafer after the wafer has been broken (cleaved). Most analytical techniques are not capable of accommodating an entire wafer because the wafers have become relatively large—i.e., six (150), eight (200) or twelve (300) inch (millimeter) diameter. Most SEMs, for example, cannot accommodate samples that are larger than approximately 2 inches$^2$ (50 mm$^2$).

Without wafer marking, if the wafer is cleaved, the user cannot locate defects within the cleaved portion. This is because the defect file is based on a coordinate system that is defined relative to the wafer's geometry. Once the wafer is cleaved, the user cannot, in general, perform a first order fiducialization to determine how the sample is oriented on the analysis tool. Since the defect file is dependent upon a wafer coordinate system, the file is useless once a wafer is cleaved.

Figure 6:
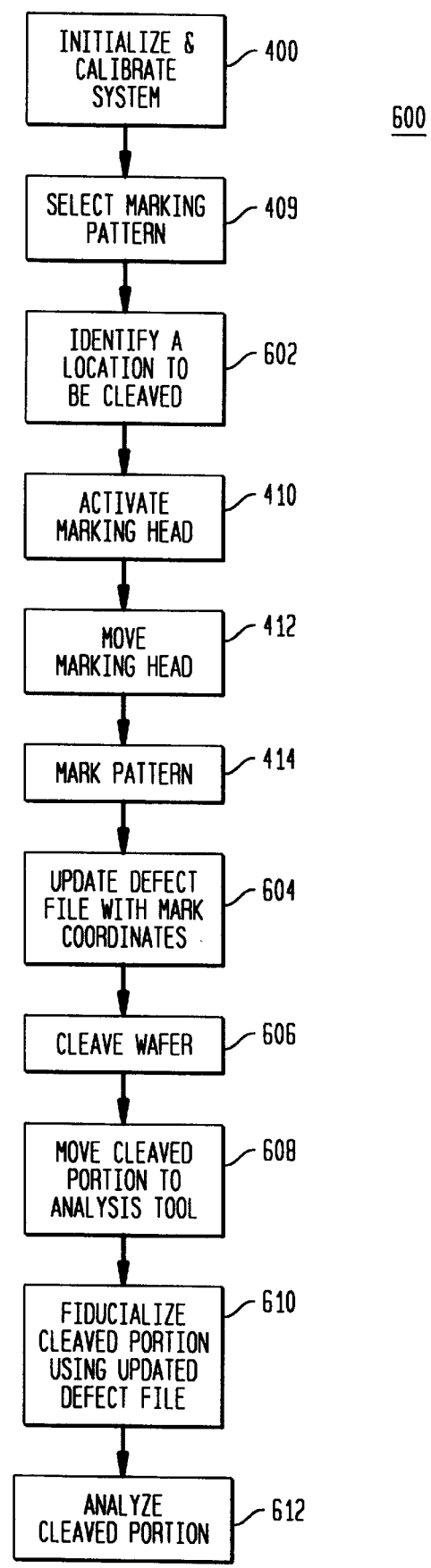
FIG. 6 depicts a flow diagram of a process for fiducializing cleaved portions of a wafer.

FIG. 6 depicts a flow diagram of a process 600 used to fiducialize a cleaved portion of a wafer using the wafer marking apparatus of the present invention. This process, in short, applies marks to a portion of a wafer that is to be cleaved and updates the defect file with these fiducialization coordinates. As such, any other tool used to analyze the cleaved portion can use the fiducialization marks to form the basis (reference axes) of a coordinate system.

Specifically, step 400 is performed in the same manner as described above with reference to FIG. 4. This step initializes the system to perform first and second order fiducialization of the wafer. At step 409, a marking pattern is selected. Generally, the marking pattern for marking a cleaved portion contains four marks that are spaced to define the size of the cleaved portion, e.g., a 50 mm$^2$ portion. The marks are selected to lie on or near the edge of the cleaved portion, so as not to interfere with the defect analysis. Preferably, once the wafer is cleaved, the marks will lie just inside each corner of the cleaved portion. At step 602, the portion of the wafer to be cleaved into diagnostic samples is identified e.g., by positioning the marking head over the portion. This is generally accomplished by selecting a defect or defects in the defect file that are to be included in the cleaved portion. The apparatus of the present invention then marks the pattern about the selected defects. At steps 410, 412, and 414, the pattern of marks is formed on the wafer as described with respect to FIG. 4.

At step 604, the coordinates of these marks are added to the defect file. The updating of the file is performed in the same manner as discussed above. In addition to the fiducialization marks for the cleaved portion, while the wafer is still whole, the wafer marker can be used to locate and mark the defects on the wafer in the manner described above. As such, a given cleaved portion may contain fiducialization marks for the cleaved portion as well as identification marks for the defects within the bounds of the fiducialization marks. The defect file is also appropriately updated.

Once marked, the wafer is conventionally cleaved, at step 606 such that a sample is produced that contains the fiducialization marks, and the defects that are to be analyzed. The sample is then relocated, at step 608, into a subsequent analysis tool, and, at step 610, the analysis tool fiducializes the sample by locating several of the fiducialization marks. If the marks are made as described above, this results in a second order fiducialization such that the defect file can be used to locate defects. At step 612, the analysis tool analyzes the defects on the cleaved portion.

The capability of fiducializing cleaved wafer portions enables the use of numerous analytical techniques that are not capable of accommodating a full-wafer. This technique will also enable the economical use of less-frequently used techniques because they can be used without the costly modifications required to convert the tools to full-wafer handling capability.

Although various embodiments which incorporate the teachings of the present invention have been shown and described in detail herein, those skilled in the art can readily devise many other varied embodiments that still incorporate these teachings.

What is claimed is:

1. Apparatus for marking a wafer comprising:
   a wafer platen;
   a wafer marking assembly, positioned above the wafer platen, having a marking head and a wafer edge probe, said wafer edge probe comprising a pin adapted to contact said wafer; and
   a drive assembly coupled to said wafer platen and said wafer marking assembly.

2. The apparatus of claim 1 further comprising:
   a controller coupled to said drive assembly and said wafer marking assembly.

3. The apparatus of claim 1 wherein the wafer platen comprises:
   a wafer support surface; and
   a wafer retainer.

4. The apparatus of claim 3 wherein the wafer retainer comprises:
   an edge pin extending from said wafer support surface;
   a notch pin extending from said wafer support surface; and
   a bias element, movably affixed to said wafer platen.

5. The apparatus of claim 1 wherein the drive assembly further comprises:
   a rotary drive coupled to said wafer platen;
   a first linear drive coupled to said wafer marking assembly; and
   a second linear drive coupled to said wafer marking assembly.

6. The apparatus of claim 5 wherein said second linear drive positions said marking head to impact said wafer to produce an indentation.

7. The apparatus of claim 1 wherein said mechanical wafer edge probe includes a transformer coupled to said pin.

8. The apparatus of claim 7 wherein the transformer is a linear variable differential transformer.

9. The apparatus of claim 1 further comprising:
   a computer, coupled to said wafer edge probe, for determining the coordinates of the periphery of the wafer and the center of the wafer.

10. The apparatus of claim 1 wherein said wafer marking assembly further comprises a surface defect locator.

11. The apparatus of claim 10 wherein said surface defect locator is an optical microscope.

12. The apparatus of claim 11 wherein the optical microscope is a dark-field microscope.

13. The apparatus of claim 11 wherein the optical microscope is coupled to a CCD array.

14. Apparatus for marking a wafer comprising:
   a wafer platen having a wafer support surface;
   a wafer marking assembly, positioned above the wafer platen, having a marking head;
   a drive assembly coupled to said wafer platen and said wafer marking assembly;
   an edge pin extending from said wafer support surface;
   a notch pin extending from said wafer support surface; and
   a bias element movably affixed to said wafer platen.

15. The apparatus of claim 14 further comprising:
   a controller coupled to said drive assembly and said wafer marking assembly.

16. The apparatus of claim 14 wherein said wafer marking assembly further comprises a defect locator.

17. The apparatus of claim 16 wherein said defect locator is an optical microscope.

18. The apparatus of claim 17 wherein the optical microscope is a dark-field microscope.

19. The apparatus of claim 17 wherein the optical microscope is coupled to a CCD array.

20. The apparatus of claim 14 wherein the drive assembly further comprises:
   a rotary drive coupled to said wafer platen;
   a first linear drive coupled to said wafer marking assembly; and
   a second linear drive coupled to said wafer marking assembly.

21. The apparatus of claim 20 wherein said second linear drive positions said marking head to impact said wafer to produce an indentation.

22. The apparatus of claim 14 further comprising:
   a computer, coupled to said probe, for determining the coordinates of the periphery of the wafer and the center of the wafer.

23. Apparatus for marking a wafer comprising:
   a wafer platen;
   a wafer marking assembly, positioned above the wafer platen, having a marking head and a wafer edge probe, the marking head is positionally coupled to the wafer edge probe; and
   a drive assembly, coupled to said wafer platen and said wafer marking assembly.

24. The apparatus of claim 23, wherein the wafer marking assembly also has a surface defect locator, wherein said surface defect locator is an optical microscope.

25. The apparatus of claim 24 wherein the optical microscope is a dark-field microscope.

26. The apparatus of claim 6 wherein the optical microscope is coupled to a CCD array.

27. The apparatus of claim 23 wherein the wafer platen comprises a wafer retainer.

28. The apparatus of claim 23 further comprising:
    a controller coupled to said drive assembly and said wafer marking.

29. The apparatus of claim 23 wherein the wafer platen comprises:
    a wafer support surface; and
    a wafer retainer.

30. The apparatus of claim 29 wherein said wafer retainer comprises:
    an edge pin extending from said wafer support surface;
    a notch pin extending from said wafer support surface; and
    a bias element, movably affixed to said wafer platen.

31. The apparatus of claim 23 wherein the drive assembly comprises:
    a rotary drive coupled to said wafer platen;
    a first linear drive coupled to said wafer marking assembly; and
    a second linear drive coupled to said wafer marking assembly.

32. The apparatus of claim 31 wherein said second linear drive positions said marking head to impact said wafer to produce an indentation.

33. The apparatus of claim 23 further comprising:
    a computer, coupled to said probe, for determining the coordinates of the periphery of the wafer and the center of the wafer.

34. A method of marking a wafer comprising the steps of:
    identifying a marking location that is proximate a defect on the surface of the wafer; and
    marking the wafer with a plurality of fiducial marks in a predefined pattern proximate to said marking location.

35. The method of claim 34 wherein said identifying step further comprises the steps of:
    providing a defect file identifying an approximate locations of a plurality of defects on said wafer;
    performing a first order fiducialization of said wafer to identify a wafer coordinate system;
    locating a plurality of defects using said approximate locations;
    accurately identifying the locations of the plurality of defects within the wafer coordinate system; and
    performing a second order fiducialization to improve the accuracy of the wafer coordinate system based upon the accurate locations of the plurality of defects to generate an updated wafer coordinate system.

36. The method of claim 35 further comprising the steps of:
    locating a defect in said plurality of defects using said updated wafer coordinate system;
    marking said defect with said plurality of fiducial marks; and
    updating said defect file with a coordinate for said plurality of fiducial marks.

37. The method of claim 34 wherein said method further comprises the step of:
    selecting a pattern for said fiducial marks.

38. The method of claim 34 wherein said locating step further comprises the step of:
    identifying a marking location using a microscope to view the surface of the wafer.

39. The method of claim 38 wherein the microscope operates in a dark-field mode.

40. The method of claim 38 wherein said marking step comprises the steps of:
    moving a marking head proximate a marking location identified with said microscope; and
    positioning said marking head to mark said wafer in said predefined pattern.

41. The method of claim 40 wherein said marking is accomplished using a laser.

42. The method of claim 40 wherein the marking is accomplished by using a physical wafer surface indentor.

43. A method of marking a wafer comprising the steps of:
    identifying a marking location is a plurality of locations defining a portion of the wafer to be cleaved; and
    marking the wafer with a plurality of fiducial marks in a predefined pattern proximate to said marking location.

44. The method of claim 43 wherein the predefined marking pattern positions the marks proximate edges of a portion of a wafer to be cleaved.

45. The method of claim 43 wherein said locating step further comprises the steps of:
    providing a defect file identifying an approximate locations of a plurality of defects on said wafer;
    performing a first order fiducialization to identify a wafer coordinate system;
    locating a plurality of defects using said approximate locations;
    accurately identifying the locations of the plurality of defects within the wafer coordinate system; and
    performing a second order fiducialization to improve the accuracy of the wafer coordinate system based upon the accurate locations of the plurality of defects to generate an updated wafer coordinate system.

46. The method of claim 45 further comprising the steps of:
    locating a defect in said plurality of defects using said updated wafer coordinate system;
    marking said defect with said plurality of fiducial marks; and
    updating said defect file with coordinates of said plurality of fiducial marks.

47. The method of claim 45 further comprising the steps of:
    locating a marking location identifying a portion of said wafer to be cleaved using said updated wafer coordinate system;
    marking said portion with said plurality of fiducial marks; and updating said defect file with coordinates of said plurality of fiducial marks.

48. The method of claim 47 further comprising the steps of:

cleaving the wafer to form a cleaved portion containing said fiducial marks; and fiducializing said cleaved portion within an analysis tool using said coordinates of said fiducial marks contained in said defect file.

49. A data structure, stored in a computer readable storage medium, comprising:

a first memory field within the medium for storing a plurality of defect locations by coordinates within a coordinate system; and a second memory field within the medium for storing a plurality of coordinates for fiducial marks corresponding to the defect location.

50. The data structure of claim 49, further comprising means for creating a field containing information that identifies the fiducial marks locations according to their coordinates.

51. The data structure of claim 50, wherein said field comprises a size value for an identifying defect location and a flag for identifying fiducial marks locations.

52. The data structure of claim 49 conforms to a standard defect file format, where an addition of a plurality of coordinates for fiducial marks conforms to the standard defect file format.

53. A wafer edge probe comprising:

a pin configured to contact said wafer edge; and a transformer coupled to said pin.

54. The wafer edge probe of claim 53, wherein said transformer is a linear variable differential transformer.

* * * * *